United States Patent [19]
Koyama

[11] Patent Number: 5,953,145
[45] Date of Patent: *Sep. 14, 1999

[54] MULTIPLE LIGHT PATH ARRANGEMENT

[75] Inventor: Hirofumi Koyama, Higashimatsuyama, Japan

[73] Assignee: Thomson Consumer Electronics S.A., Courbevoie, France

[*] Notice: This patent issued on a continued prosecution application filed under 37 CFR 1.53(d), and is subject to the twenty year patent term provisions of 35 U.S.C. 154(a)(2).

[21] Appl. No.: 08/428,290

[22] Filed: Apr. 25, 1995

[30] Foreign Application Priority Data

Apr. 27, 1994 [GB] United Kingdom ................... 9408323
Apr. 27, 1994 [GB] United Kingdom ................... 9408324
Apr. 27, 1994 [GB] United Kingdom ................... 9408340

[51] Int. Cl.$^6$ .................................................. H04B 10/00
[52] U.S. Cl. .......................... 359/152; 359/172; 250/574; 250/575
[58] Field of Search ..................... 359/109, 117, 359/127, 128, 130, 154, 157, 164, 167, 172, 173; 250/574, 575, 435; 385/16, 31

[56] References Cited

U.S. PATENT DOCUMENTS

| | | | |
|---|---|---|---|
| 3,513,443 | 5/1970 | Andersen | 359/152 |
| 3,628,027 | 12/1971 | Brauss | 250/216 |
| 3,915,575 | 10/1975 | Sick | 385/33 |
| 4,124,860 | 11/1978 | Johnson | 357/19 |
| 4,262,362 | 4/1981 | Kierman et al. | 359/131 |
| 4,293,826 | 10/1981 | Seifres et al. | 331/94.5 |
| 4,378,143 | 3/1983 | Winzer | 385/31 |
| 5,122,893 | 6/1992 | Tolbert | 359/152 |
| 5,136,152 | 8/1992 | Lee | 250/211 |
| 5,140,152 | 8/1992 | Van Zeghbroeck | 250/214 |
| 5,181,264 | 1/1993 | Chiaretti et al. | 385/33 |
| 5,253,312 | 10/1993 | Payne et al. | 385/31 |
| 5,526,245 | 6/1996 | Davis et al. | 359/147 |
| 5,528,407 | 6/1996 | Nakata et al. | 359/152 |
| 5,640,262 | 6/1997 | Hanai et al. | 359/195 |

FOREIGN PATENT DOCUMENTS

| | | |
|---|---|---|
| 2040490 | 8/1980 | United Kingdom . |
| 0209108 | 7/1986 | United Kingdom . |
| 2237123 | 3/1990 | United Kingdom . |

*Primary Examiner*—Rafael Bacares
*Attorney, Agent, or Firm*—Joseph S. Tripoli; Peter M. Emanuel; Frederick A. Wein

[57] ABSTRACT

The present invention relates to an arrangement for a multiple light path, which may be used for a wireless optical audio and/or video communication system.

Known systems use a direct wireless infrared connection. It has been found that such a connection is not reliable enough. It is the object of this invention to realise a reliable infrared connection between different devices. This is realised by a two path connection. A first path is realised by a wireless connection and a second path is realised by a transmission at least partially through an optical fiber. Furthermore this invention presents a special lens and a special photo light emitting diode for the realisation of the two path infrared connection.

The invention can used e.g. for the connection between a television set and a video cassette recorder.

4 Claims, 8 Drawing Sheets

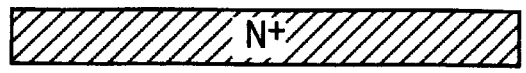
Fig.11a
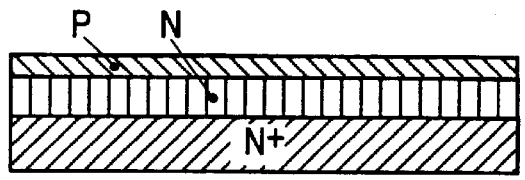
Fig.11b
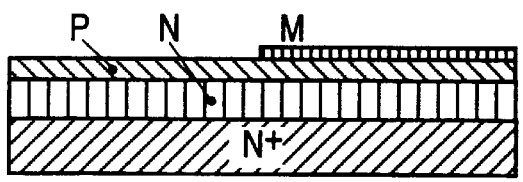
Fig.11c
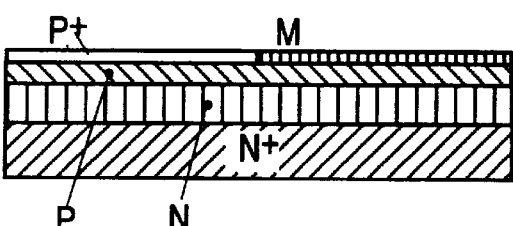
Fig.11d
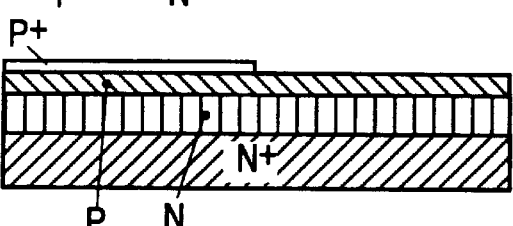
Fig.11e
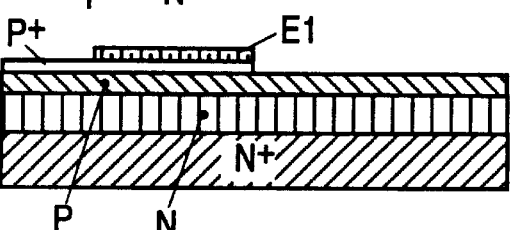
Fig.11f
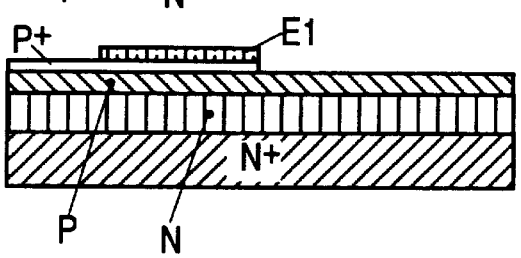
Fig.11g
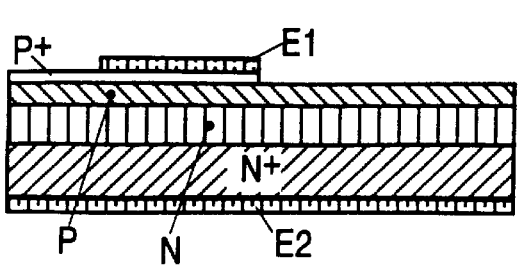
Fig.11h
Fig.11

MULTIPLE LIGHT PATH ARRANGEMENT

The present invention relates to an arrangement and a method for a multiple light path, which may be used for a wireless optical A/V (audio and/or video) communication system.

It is well known to provide an optical link by infrared (IR) ray between different cooperating devices, like e.g. between an audio receiver and a headset, between a remote controler and a TV set, between a video tape recorder (VTR) and a TV set. Each of these devices have an IR receiver and/or an IR transmitter in front of each other, respectively. Thereby a wireless optical communication system can be realised if the light power and divergence angle are properly set.

It has been found that the communication between said cooperating devices can be disturbed or even be interrupted due to the fact that the IR ray connection is disturbed. This can happen due to different reasons, like e.g. dust, persons, animals, etc.

It is the object of the present invention to reduce such communication disturbances.

This object is solved by the invention according to the independend claims. Advantageous embodiments are protected by the subclaims.

According to the present invention at least two optical links are provided between the cooperating devices; or more precisely between an optical transmitter, which may include a light emitting area like a light emitting diode (LED), a laser or the like and an optical receiver, which may include a light receiving area like a photo detector, a photo diode (PD) or thelike. In the further description the light emitting area is also called LED and the light receiving area is also called PD without any restrictions to the present invention.

At least one optical link is realised by the IR transmission from an optical transmitter to an optical receiver via air. And at least one other optical link is realised by IR transmission from the optical transmitter at least partially via an optical fibre to the optical receiver.

Although the further description of the invention is done with the aid of a TV set and a VTR, it may be mentioned that the invention is not restricted to such cooperating devices.

For reducing the costs of the optical transmitter and/or the optical receiver it is proposed for a preferred embodiment to use a lens body which is linked to the light emitting area or to the light receiving area, respectively. By the lens body the optical signal of the emitting area can be guided as well into the air as into an optical fibre. Using such a lens body for the receiving area, optical rays may be led as well from air as from an optical fibre.

The lens body has at least one small portion of a reflective element which is built into the lens body and forms the entry and/or end area for an optical fibre path. The reflective element makes an angle with the direction of incoming or outgoing beams. Said reflective layer guides into the lens incoming ray into a beam waveguide stud or optical fibre sideways provided at lens. This stud is preferably manufactured from the material which has the same optical characteristics as the lens. The lens itself is preferably a plastic spherical lens having a levelled side, where may be arranged the LED or the LP. To the optical fibre may be also arranged a LED or PD. By using a LED and PD with the modified lens, it is possible to have a multiple light path, namely for example, a LED can transmit ray into air and into an optical fibre simultaneously and a PD can receive ray from air and from an optical fibre simultaneously.

The reflective element of the lens body can be realised as reflective layer which may be coated with reflective material. The reflective element can also be realised without coating a surface for reflection or without using a half mirror.

The mostly used lens body in connection with LED or PD is optical plastic and therefore a multiple light path arrangement is provided by a triangular cavity within a plastic lens body.

The reflective indexes of air and of optical plastic such as polymethylmethacrylate are about 1 and 1.5 respectively, and their critical reflective angles are about 45 degrees. Therefore, if a triangular cavity having about 45 degrees is made in the plastic, the part which is angular to the levelled side of the lens becomes reflective because it is exposed to air, and it is not necessary to arrange and to coat a surface for reflection by any material.

The angular part of the cavity forms a reflective wall and forms the entry and/or radiance area for an optical fibre path which is sideways arranged. The reflective wall guides into the lens incoming ray into a beam waveguide or optical fibre which is sideways provided at lens.

In principle it is also possible to built into a lens more than one reflective element.

A further embodiment of the invention includes a special element which works as well as LED as as receiver PD.

LEDs are well known. The LEDs are made in such a way that they should have a maximum emission efficiency of light. PDs are also well known and are made in such a way that they have a maximum sensitivity for light.

However for a wireless optical audio and video (A/V) communication system it is desirable to have only one optical element which makes it possible to transmit and to receive simultaneously modulated optical signals.

It is one aspect of this embodiment to provide a photo light emitting diode, in the following called PLED, which may be used for simultaneously transmission/receiving of modulated optical signal and may be manufactured as one unit on the same chip.

The PLED used in this embodiment has a PD part and a LED part which are arranged side by side at the same chip. Afterwards the PLED chip is arranged in a small pan or cup and connected to exterior electrodes.

Further details and advantages will now be described with reference to embodiments and accompanying drawings, in which:

FIG. 11 illustrates steps for manufacturing a PLED;

Figure 1:
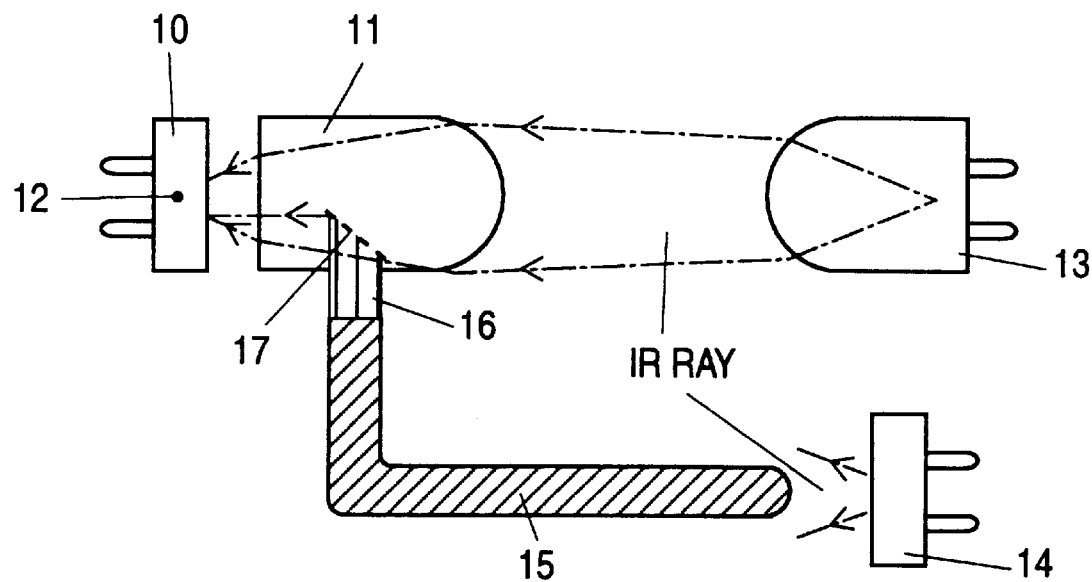
FIG. 1 shows a first embodiment for receiving IR signals simultaneously via two paths.

A first embodiment of a wireless optical communication system according to the invention is shown in FIG. 1.

In FIG. 1 a photo detector 10 is arranged at a levelled side of a modified spherical lens body 11 near the focal point 12 and receives rays simultaneously as well from a first light emitting diode (LED) 13 as from a second LED 14.

The ray from the first LED 13 comes through air and passes the lens body 11 and the ray from the second LED 14 comes through an optical fibre 15 connected with a stud 16. The stud 16 guides the ray to a reflective element 17 where the direction is changed and afterwards rays are directed also to the PD 10. This embodiment provides a dual light path arrangement for reception.

Means with equal functions as in FIG. 1 have got the same reference numbers in the further description and will be explained only as far as it is necessary for the understanding of the invention.

Figure 2:
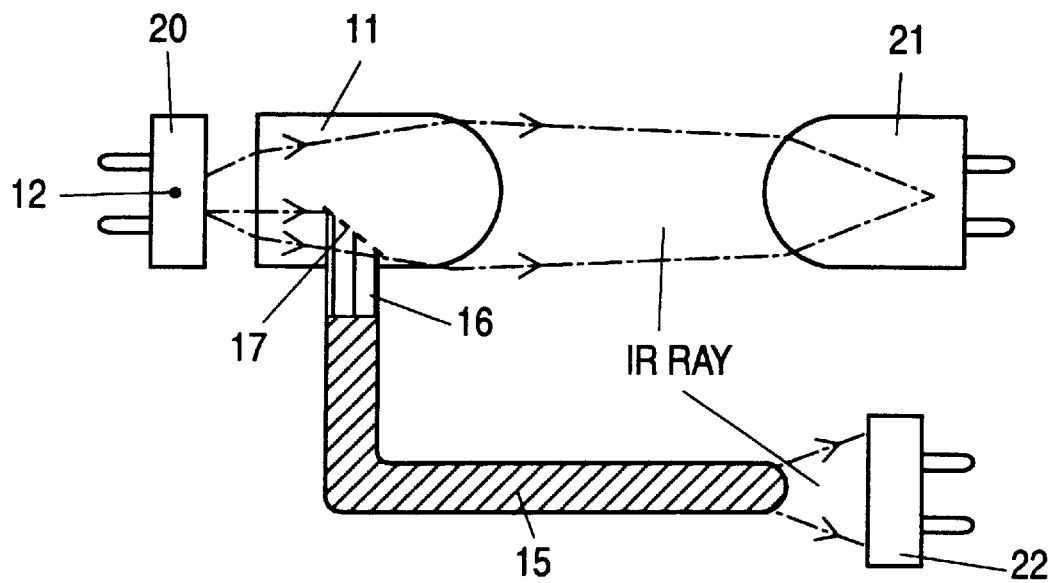
FIG. 2 shows a second embodiment for transmitting IR signals simultaneously via two paths.

FIG. 2 shows a dual path arrangement for transmission. The difference compared to the embodiment of FIG. 1 is that a third LED 20 is provided at the levelled side of the lens body 11 and that this LED 20 transmits rays via two paths simultaneously to a second PD 21 and to a third PD 22.

A first part of the ray of the LED 20 passes the lens body 11 and radiates via air to the second PD 21. A second part of the emitted ray is reflected at the reflective element 17 and passes via the stud 16 and the optical fibre 15 to the third PD 22.

Figure 3:
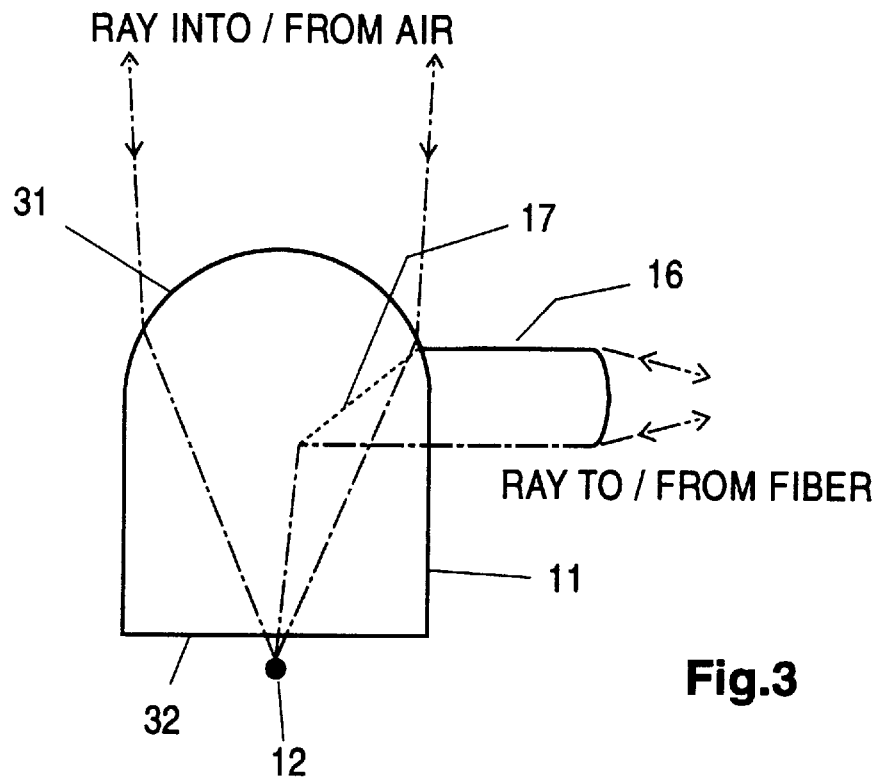
FIG. 3 shows a side view of a lens body and according radiation paths.

FIG. 3 shows in more detail the lens body 11 and the according rays. The lens body 11 has a convex surface 31 at one end and a levelled surface 32 at the other end. This lens body 11, also called a spherical lens, contains inside the reflective element 17 and forms in connection with optical transmitters and receivers a multi light path arrangement. The lens body 11 is preferably a plastic spherical lens and the reflective element 17 is raised in this embodiment by a piece of flat metal. This element 17 may be also a semi reflective layer which is raised by a metal evaporation. The reflective element 17 forms an angle with the optical axis of the lens.

The reflective element 17 was brought into the spherical lens during the manufacturing process. First a beam waveguide which may be made from the same material as the plastic spherical lens or from an optical fibre is bevelled as a bevel at the end which shall be raised within the lens. Then the reflective element 17 is applied to the bevel and afterwards this prepared end of the beam waveguide is brought into a mould in that the plastic spherical lens will be shaped. Thereby the optical axis of the beam waveguide is orthogonal arranged to the optical axis of the spherical lens and the prepared surface is angled aimed to convex side of lens. The beam waveguide forms the stud 16 which protrudes from the side of spherical lens. This stuck out end is at its end prepared for a connection with an optical fibre or direct coupled to a LED or PD. Therefore the end of stud 16 may be convex shaped and forms a second lens. The end of optical fibre may be also coupled to LED or PD.

The reflective element 16 on the beam waveguide within the lens body 11 changes the direction of an incoming and outgoing ray or light especially by reflection of ray from or to the levelled side 32 of the spherical lens 11 as shown in FIGS. 1 and 2.

The spherical lens body 11 has the focal point 12 outside and in front of the level led side 22 of the spherical lens.

Figure 4:
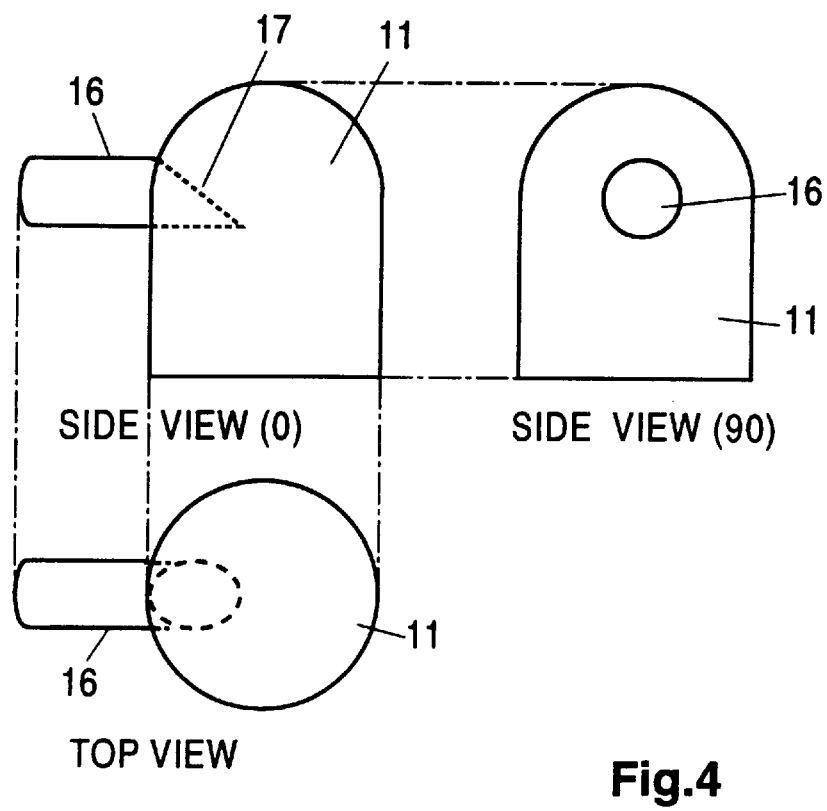
FIG. 4 shows schematically three views of the lens body of FIG. 3.

FIG. 4 shows three different views of the lens body 11, that is a top view, a side view (0) and a side view (90).

The side view of FIG. 4 illustrates that the stud 16 is homogenous putted up within the spherical lens 11 and the reflective element 17 within the spherical lens 11 makes an optimum angle with the levelled side 32 of the spherical lens 11. The reflective element 17 extends from the surface at the side of spherical lens 11 to near the centre.

For reducing a shadow effect of the reflective element 17 this can be realised as a semi reflective layer. It is also possible to minimise the diameter of stud 16.

Figure 5:
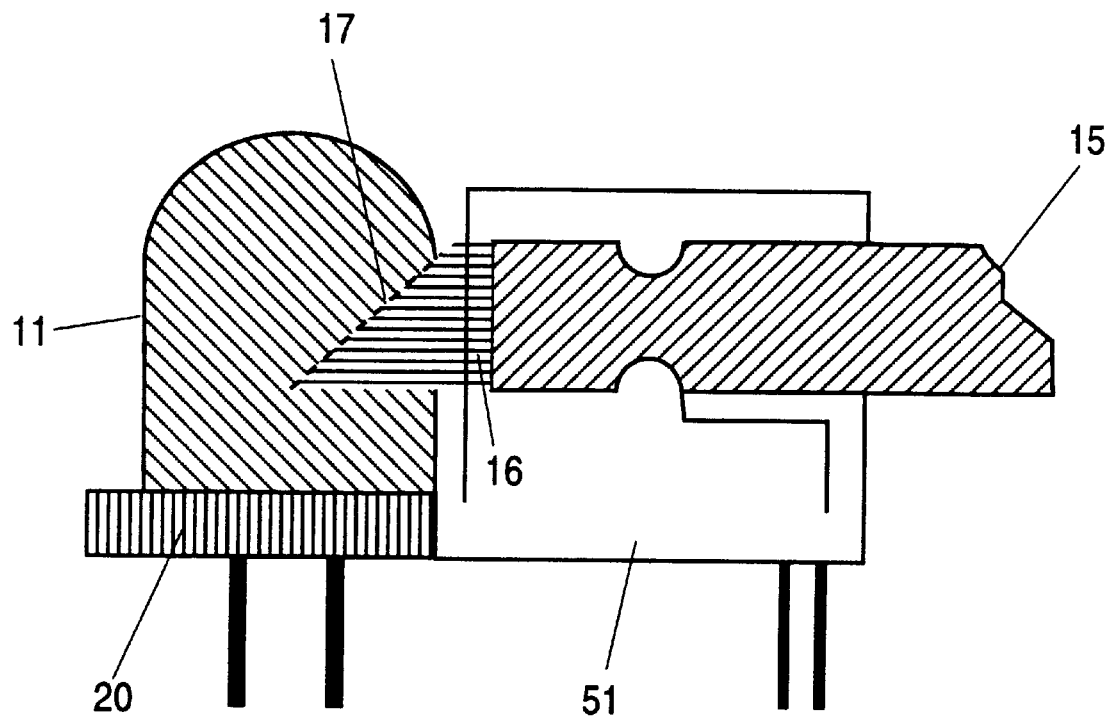
FIG. 5 shows schematically the connection of an optical fibre to the lens body.

FIG. 5 shows schematically an example for the arrangement concerning the lens body 11. The lens body 11 is connected with a fastener 51 and has for example the LED 20 or a PD (see FIG. 1) which is arranged at the levelled side 32. The fastener 51 connects the optical fibre 15 to the lens 11 and gives optical fibre 15 the direction to the reflective element 17. The LED 20 or PD is preferably moulded in the lens body 11 and it is mounted on an optical fibre fastener 51, which can also be called optical fibre receptacle.

Figure 6:
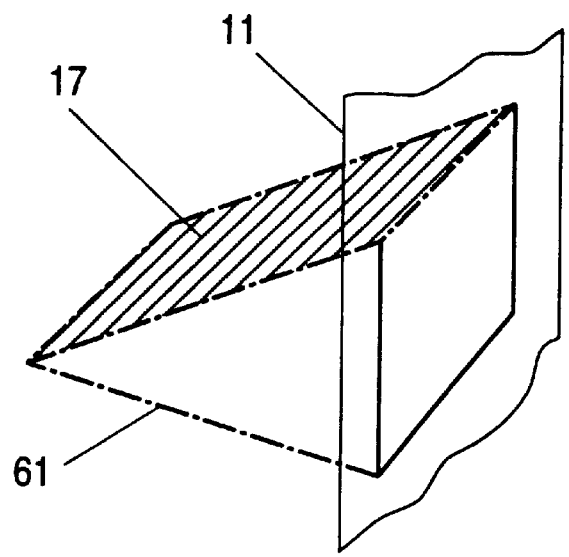
FIG. 6 shows a wedge cavity within a plastic body.
Figure 7:
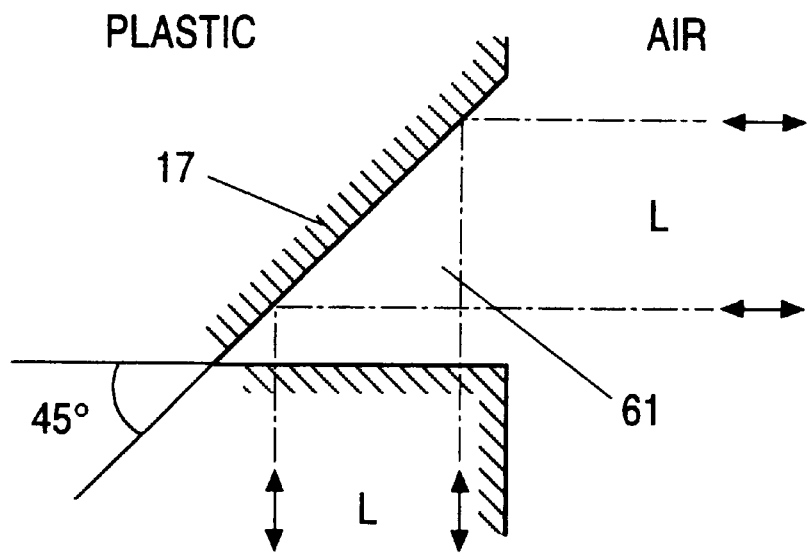
FIG. 7 illustrates the principle of reflection.

FIG. 6 illustrates a special wedge cavity 61 within a plastic body of lens 11 which makes it possible to realise a reflective element 17 without coating the according surface. FIG. 7 shows the principle of reflection of this cavity 61. The principle of this cavity 61 is as follow.

The reflective indexes of air and of optical plastic, such as polymethylmethacrylate, are about 1 and 1.5 respectively, and their critical reflective angles are about 45 degrees. Therefore, if a triangular cavity having about 45 degrees is made in the plastic, the part which is angular to the levelled side 32 becomes reflective because it is exposed to air. In such a way it is not necessary to arrange and to coat a surface for reflection by any material.

Figure 8:
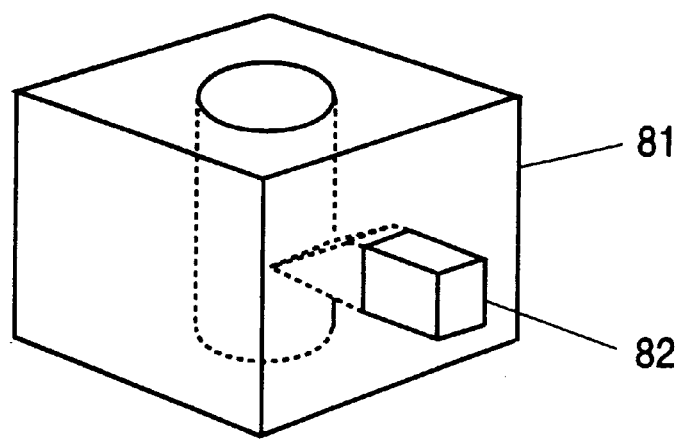
FIG. 8 shows a mould for manufacturing a lens body for a multiple light path arrangement.

FIG. 8 shows a mould 81 having the contour of lens body 11 inside. This mould 81 can be used for manufacturing the multiple light path apparatus. A slide 82 is sideways arranged within this mould 81 for forming up the wedge cavity 61 within lens body 11. Melted or liquid optical plastic is put into the mould 81. When the material is hardened the lens body 11 is pulled.

A further embodiment of the multiple light path arrangement according to the invention uses not just the photo detector 10 or the third LED 20 as shown in FIG. 1 or FIG. 2 respectively, but uses a photo light emitting diode (PLED) which can be used for simultaneously receiving and transmitting light radiation such as IR light.

Figure 9:
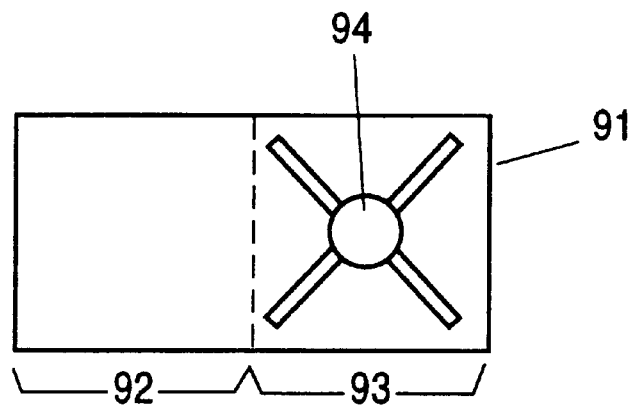
FIG. 9 shows a PLED chip including a PD and a LED part.

FIG. 9 shows schematically a top view of a PLED chip 91. The PLED chip 91 according to this embodiment consist of a PD part 92 and a LED part 93 on an rectangular area which is double in size comparing with a conventional LED. The PD part 92 and the LED 93 part are arranged side by side on the same chip.

Figure 10:
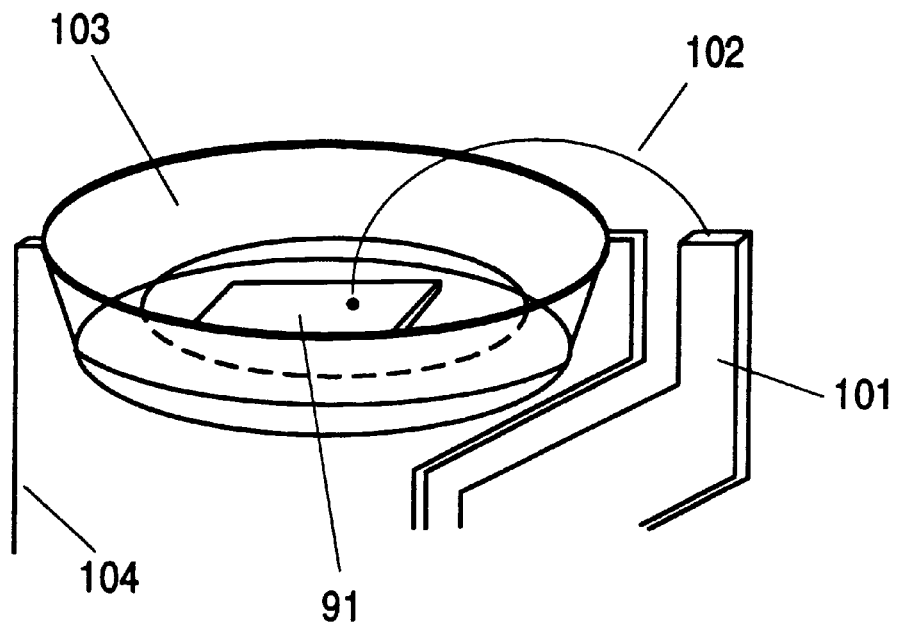
FIG. 10 illustrates the basic construction of PLED.

An electrode 94 faces the surface of the LED part 93. This electrode 94 is coupled to a first exterior electrode 101 by a bonding wire 102 as illustrated in FIG. 10. The PLED chip 91 may be arranged within a reflective cup 103.

A connection to a second exterior electrode 104 is made by a not shown bottom electrode of the PLED chip 91. The PLED 91, as illustrated FIG. 10, is designed to be used for receiving and/or emitting infrared ray or modulated optical signal. The PLED 91 emits an electrically modulated infrared ray and also detects an electrically modulated infrared ray.

FIG. 11, which includes the FIGS. 11a–11h, illustrates the method for manufacturing a PLED chip. This method is characterised by the following steps:

FIG. 11a: preparing (cleaning, etc.) a GaAs wafer

FIG. 11b: fluid epitaxial growth

FIG. 11c: masking for PD

FIG. 11d: ZN diffusion

FIG. 11e: mask M removal

FIG. 11f: electrode formation of first electrode E by metal evaporation

FIG. 11g: polishing rear side

FIG. 11h: electrode formation of second electrode E3 by metal evaporation.

The manufacturing process is based on a GaAs wafer and a fluid epitaxial growth for LED analogic to the first two steps of manufacturing an LED. But the process respecting to photo diode PD is changed so that the P+ layer, which is assisting to increase the current density for light emission is not made and then only the P-N junction area which gives a photo current is enlarged. The third step concerns masking the half surface of layer P for establishing the PD part 92. The next step is Zn diffusion for setting up a layer P+. After mask removal follows an electrode formation by metal evaporation on a section of layer P+ surface. This sets up the first electrode E1. After this the next step is polishing rear side and then a second electrode formation had been done by metal evaporation at the bottom side for setting up a second electrode E2 as shown in FIG. 11.

This PLED chip can be arranged in a cup according to FIG.10 and adjusted near the focal point 12 of the lens body 11 such that simultaneous transmission and reception of rays is possible as well via air as via the optical fibre 15.

Figure 12:
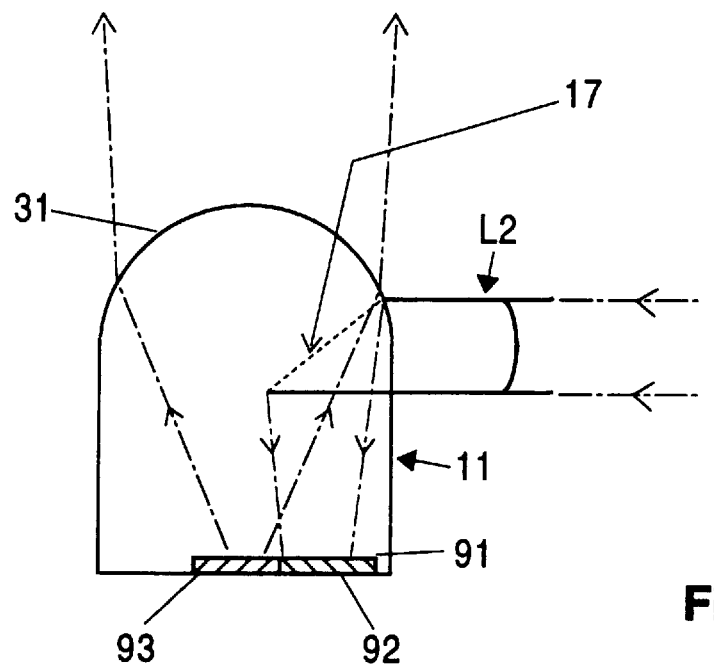
FIG. 12 shows an arrangement with PLED for light reception via fibre.

It is also possible to integrate the PLED 91 in the lens body 11 near the levelled side 32. This can be realised such that IR ray is emitted into air and light from a beam waveguide or optical fibre is detected or received as shown in FIG. 12. Therefore the LED part 93 can be arranged in the centre of the lens body and opposite to the convex surface 31. The PD part 92 is provided such that reflected light from the reflective element reaches the PD part 92. For concentrating the reflected light a lens (not shown) can be provided inside the lens body 11.

Figure 13:
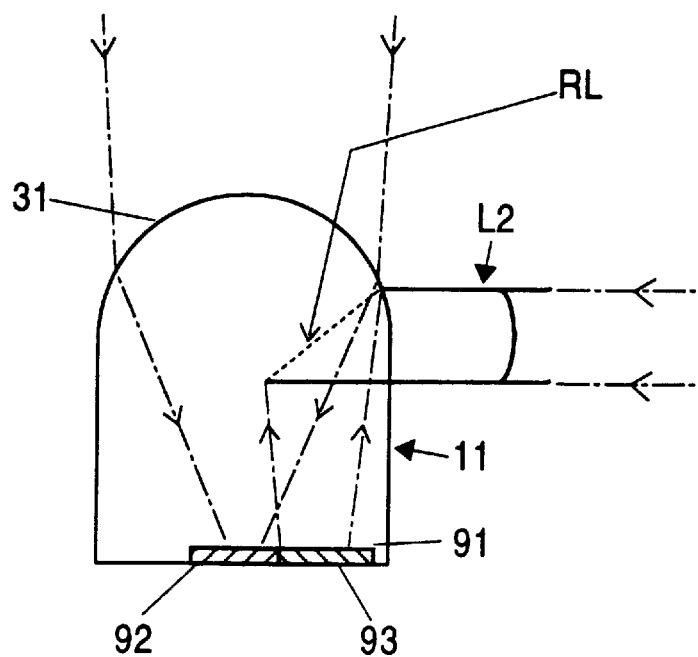
FIG. 13 shows an arrangement with PLED for light transmission via fibre.

Referring to FIG. 13 the PD 92 is arranged in the centre of the lens body 11 and the LED part 93 is turned to reflective element 17. This is the only difference compared to FIG. 12 embodiment. Thereby it is possible that infrared ray coming from the air can be detected and that infrared ray or light can be transmitted through the optical fiber 15 or beam waveguide simultaneously.

In the case of PLED 91 it is more effective to use the modified or dual light path lens because the focal point of the not shown lens for the rays via the reflective layer RL can be placed on different point than the focal point of the convex lens 31. Therefore the PLED 91 can be used for the two different functions as shown in FIG.12 and FIG. 13.

Figure 14:
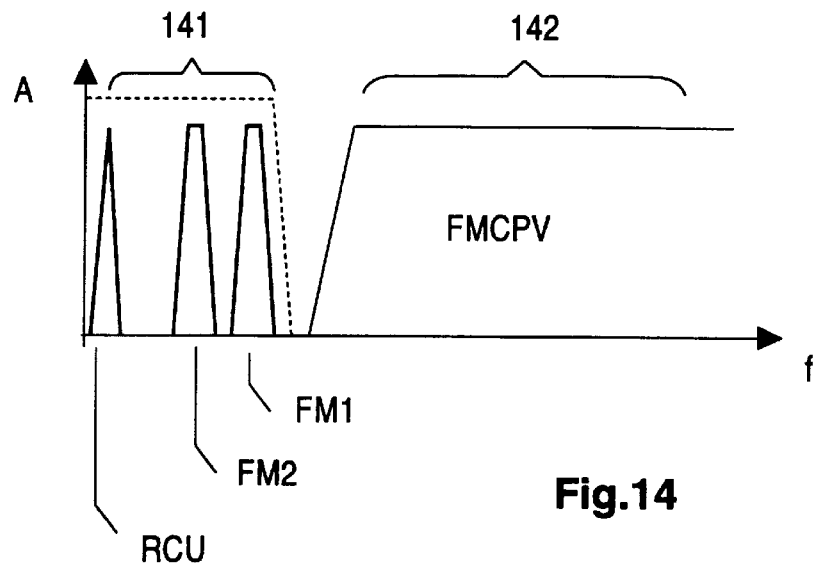
FIG. 14 illustrates an example for frequency allocation.

By the above explained embodiments it is possible to transmit and to receive audio and video (AV) signals. Different modulation can be used in order to apply the simultaneous functions for both detection and transmission. FIG. 14 shows a diagram of signal amplitudes A in dependence on frequency f and gives an example of frequency allocation for a detection part 141 and a transmission part 142.

The detection part 141 includes a first frequency in the range of 40 to 400 kHz named as RCU for a remote control signal. A second and a third detection signal may be radio frequencies FM1, FM2 for right and left audio channel. In this embodiment the said frequencies are preferred in the range of 2.3 and 2.8 MHz respectively.

The transmission part 142 includes for example a composite video signal FMCPV of about 13 MHz. Such frequency allocation is for example useful for a system illustrated in FIG. 15. The PLED 91 emits an electrically modulated infrared ray and also detects an electrically modulated infrared ray. Therefore each of frequency spectrums should not consider and their frequency allocation for modulation should be considered.

Figure 15:
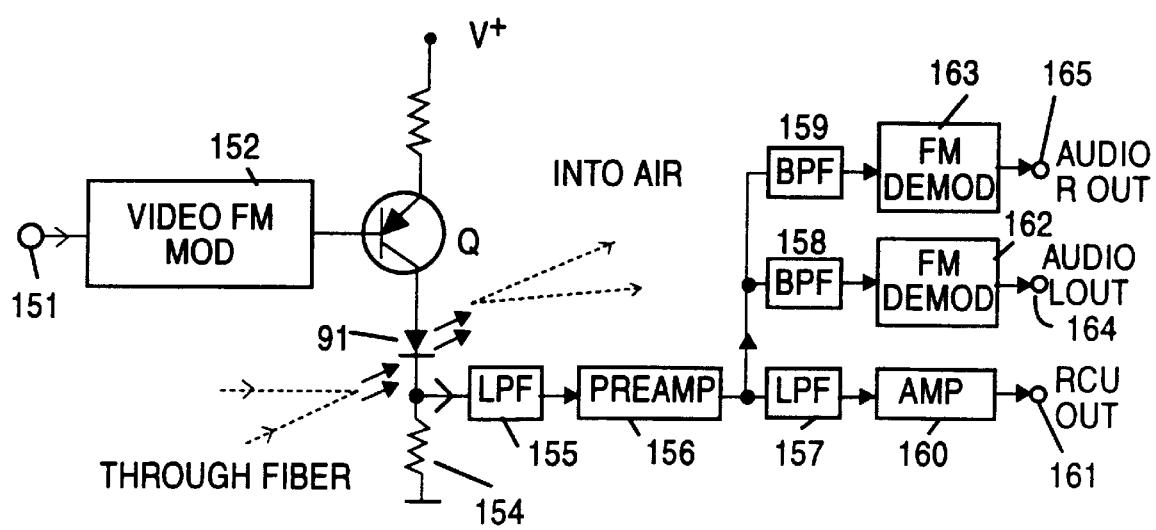
FIG. 15 shows a block diagram for a wireless optical communication system.

Referring to FIG. 15 a not shown video signal source is coupled to an input terminal 151 and passes a video radio frequency modulator 152 which is coupled to a base terminal of a pnp transistor 153. This transistor 153 drives the PLED 91 which is coupled to the collector and the collector path includes also a resistor 154 coupled to ground. Instead of the resistor 154 any other electrical component, such as capacitor, diode, etc could be used which generates a voltage in dependence on the current generated by the PLED 91.

The joint between PLED 91 and the component 154 is connected with a first low-pass filter 155. The output terminal of said low-pass filter 155 is coupled via a preamplifier 156 to a second low-pass filter 157, to a first bandpass filter 158 and to a second pand pass filter 159. The low pass filter 157 selects a remote control signal and leads it via an amplifier 160 to an according output terminal 161. By the band pass filters 158, 159 are the signals of the left and the right audio channel selected. The selected signals are led to according FM demodulators 162 or 163 respectively which lead their output signals to the terminals 164 or 165 respectively.

This system may especially advantageous when a PLED is used for video signal transmission through a lens and audio signal and/or remote control signal detection through an optical fiber or beam waveguide. Such a system is especially useful for a wireless optical communication system.

I claim:

1. A multiple light path apparatus comprising a reflective layer within a lens forming an entry or an end portion for a beam waveguide, said layer forming an angle with an optical axis of the lens, the layer being arranged outside of the focal point and optical axis of said lens, and the layer being formed by a cavity within a side wall of the lens.

2. The apparatus according to claim 1 wherein said reflective layer is a semi reflective layer or a smaller portion of a full reflective layer.

3. The apparatus according to claim 1 wherein said lens is a spherical lens having a beveled side coupled to an LED or photodiode.

4. The apparatus according to claim 1 wherein said reflective layer is formed by a generally triangular cavity having about 45 degrees to a beveled side of said lens and being exposed to air.

* * * * *